United States Patent
Wan et al.

(10) Patent No.: US 9,190,961 B1
(45) Date of Patent: Nov. 17, 2015

(54) DIGITALLY-PROGRAMMABLE GAIN AMPLIFIER WITH DIRECT-CHARGE TRANSFER AND OFFSET CANCELLATION

(71) Applicant: Hong Kong Applied Science & Technology Research Institute Company Limited, Hong Kong (HK)

(72) Inventors: Ho Ming (Karen) Wan, Hong Kong (HK); Kwai Chi Chan, Hong Kong (HK); Tin Ho (Andy) Wu, Hong Kong (HK)

(73) Assignee: Hong Kong Applied Science & Technology Research Institute Company, Limited, Hong Kong (HK)

( * ) Notice: Subject to any disclaimer, the term of this patent is extended or adjusted under 35 U.S.C. 154(b) by 35 days.

(21) Appl. No.: 14/264,252

(22) Filed: Apr. 29, 2014

(51) Int. Cl.
*H03F 1/02* (2006.01)
*H03F 3/00* (2006.01)
*H03F 3/45* (2006.01)
*H03G 3/00* (2006.01)

(52) U.S. Cl.
CPC .............. *H03F 1/0233* (2013.01); *H03F 3/005* (2013.01); *H03F 3/45071* (2013.01); *H03G 3/002* (2013.01); *H03F 2200/249* (2013.01); *H03F 2200/471* (2013.01); *H03F 2203/45116* (2013.01)

(58) Field of Classification Search
CPC ........................................................ H03F 1/02
USPC ..................................................... 330/9, 144
See application file for complete search history.

(56) References Cited

U.S. PATENT DOCUMENTS 4,555,668 A * 11/1985 Gregorian et al. ................. 330/9
6,166,581 A    12/2000 Liu et al.

OTHER PUBLICATIONS

L.Yan et al, "A 0.5uVrms 12-uW Wirelessly Powered Patch-Type Healthcare Sensor for Wearable Body Sensor Network", IEEE Journal of Solid-State Circuits, vol. 45, No. 11, pp. 2356-2365, Nov. 2010.
Fujimori et al: "A multi-bit Sigma Delta Audio DAC with 120dB dynamic range", IEEE Journal of Solid-State Circuits, vol. 35, No. 8, pp. 1066-1073, Aug. 2000.

* cited by examiner

*Primary Examiner* — Steven J Mottola
(74) *Attorney, Agent, or Firm* — Stuart T. Auvinen; gPatent LLC

(57) ABSTRACT

A Programmable-Gain Amplifier (PGA) has a digital value that programmably adjusts the gain of the analog amplifier. A variable capacitor has several switched sub-capacitors that are enabled by the digital value. Enabled sub-capacitors are switched between a sampled input and a virtual ground on one terminal, and connect to a summing node on the other terminal. The summing node connects to the inverting input of an op amp either through a switch or through a double-sampling capacitor that stores an offset. A feedback capacitor is in parallel with a sampling capacitor during a second clock phase when direct-charge transfer occurs, reducing power consumption of the amplifier. The feedback capacitor samples the sampled input during the first clock phase. The PGA gain is proportional to the sum of capacitances of enabled sub-capacitors. The gain can be adjusted for sensor inputs to an Analog Front-End (AFE), such as for an electrocardiogram (ECG).

19 Claims, 13 Drawing Sheets

DIGITALLY-PROGRAMMABLE GAIN AMPLIFIER WITH DIRECT-CHARGE TRANSFER AND OFFSET CANCELLATION

FIELD OF THE INVENTION

This invention relates to amplifiers, and more particularly to programmable-gain amplifiers for Analog Front-End (AFE) applications.

BACKGROUND OF THE INVENTION

Wearable devices may include sensors to collect physical data such as a heartbeat, perspiration salinity, brain waves, muscle activity, or other electrical activity. Since the electric signals collected are so minute, amplification is necessary before they can be converted from analog to digital signals and be processed digitally such as by a digital-signal processor (DSP).

Wearable devices that are small and light are desirable, but the signal quality must still be sufficient to be useful. Small physical sizes, high noise immunity, and ultra-low power consumption are design goals. Complementary metal-oxide-semiconductor (CMOS) manufacturing processes or derivates or variants are often used to produce integrated Analog Front-End (AFE) devices.

FIGS. 1A, 1B show noisy and cleaned waveforms. FIG. 1A shows an input signal that might be picked up by a sensor such as by electrodes touching a person's skin. A large amount of noise is present. FIG. 1B shows a signal output from an AFE. The noise signal of FIG. 1A has been cleaned up to produce the output signal of FIG. 1B. This signal could be a heartbeat on an electro-cardiogram (ECG or EKG) collected by the electrodes.

FIG. 2 shows an Analog Front-End (AFE). The noisy input such as shown in FIG. 1A is applied to electrodes 114, amplified, and converted to a digital signal to produce the cleaned up signal of FIG. 1B. The signal of FIG. 1B could also be the input to ADC 110 rather than its output.

Oscillator 102 generates a clock that is applied to chopping clock generator 104 to generate chopping clocks that operate choppers 116, 118 to sample signals from electrodes 114 which are buffered by chopping amplifier 12.

A Programmable-Gain Amplifier (PGA) clock is generated by PGA clock generator 106 and applied to PGA 10. PGA 10 has a gain that is programmable. Programming the gain allows the flexibility to tune the amplitude and bandwidth so that vital signs of different magnitudes and frequencies can be monitored and better isolated.

Band selection filter 112 may be a switched-capacitor filter to filter the output from PGA 10, such as to better select desired frequencies. This can be considered part of the PGA as the PGA is a 1$^{st}$ order low pass filter. Driver 14 drives the analog input to ADC 110, which converts this analog signal to a digital value, such as by using a Successive-Approximation Register (SAR). ADC clock generator 108 generates a clock to ADC 110.

Bias network 120 samples the input from electrodes 114 and biases chopping amplifier 12, PGA 10, and driver 14. Other biasing, control, or filters may be present.

What is desired is a Programmable-Gain Amplifier (PGA). A PGA for applications such as an AFE shown in FIG. 2 is also desired. A programmable gain amplifier using switched capacitors to program the gain is desirable. A PGA using direct charge transfer or correlated double sampling, or both, is also desired.

DETAILED DESCRIPTION

The present invention relates to an improvement in Programmable-Gain Amplifiers (PGA's). The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1B:
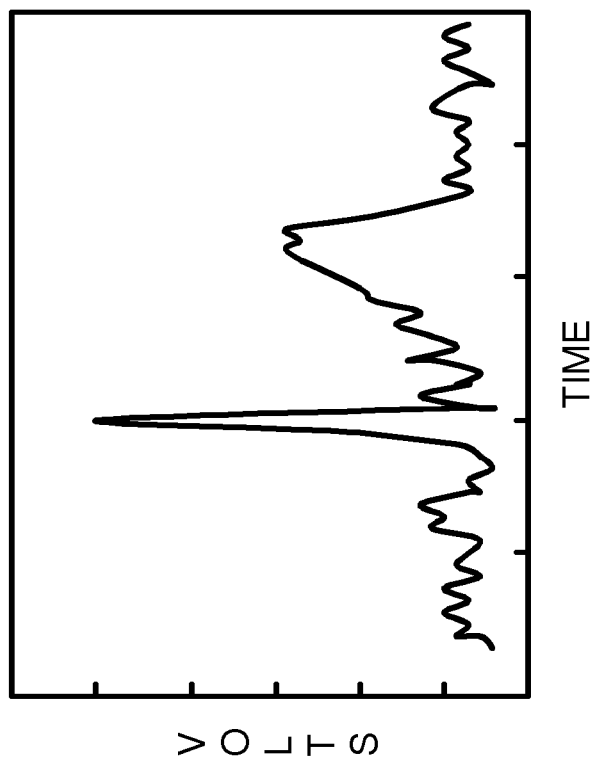
FIGS. 1A, 1B show noisy and cleaned waveforms.
Figure 1A:
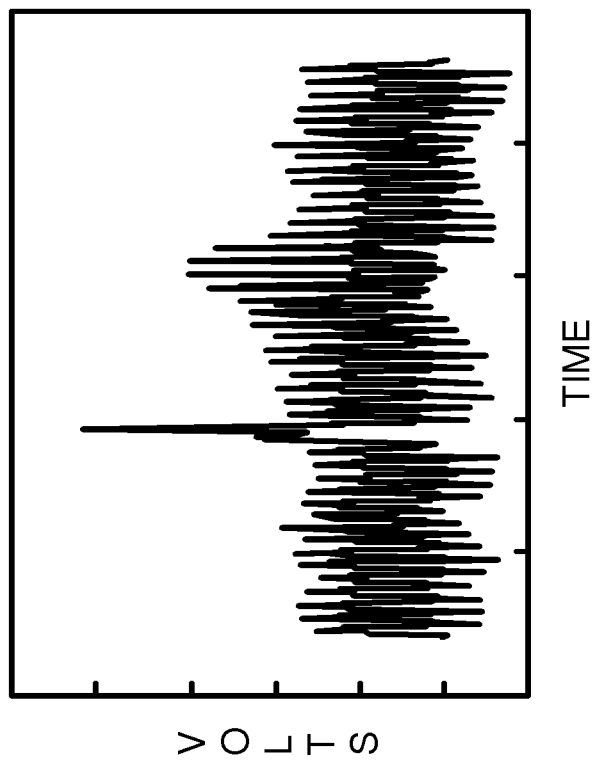
Figure 2:
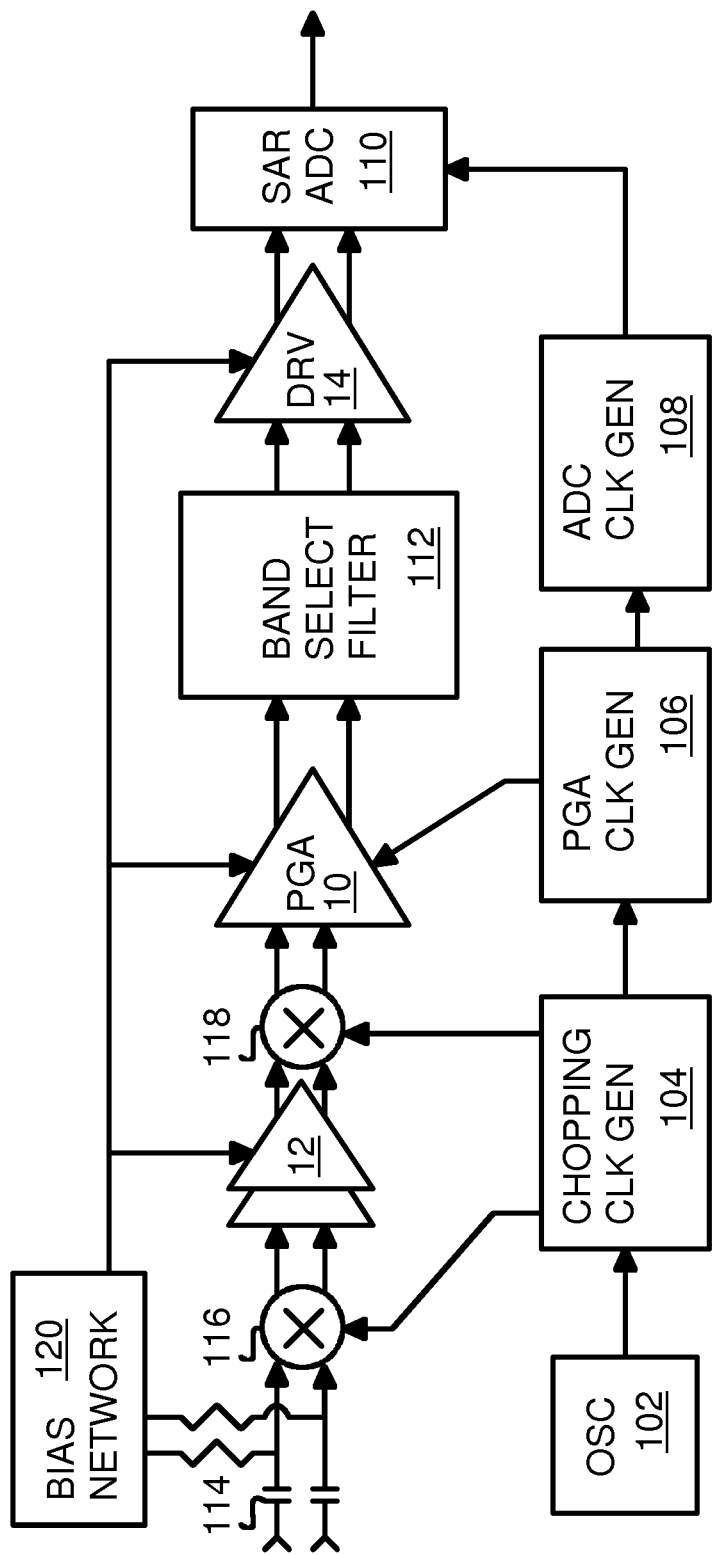
FIG. 2 shows an Analog Front-End (AFE).
Figure 3:
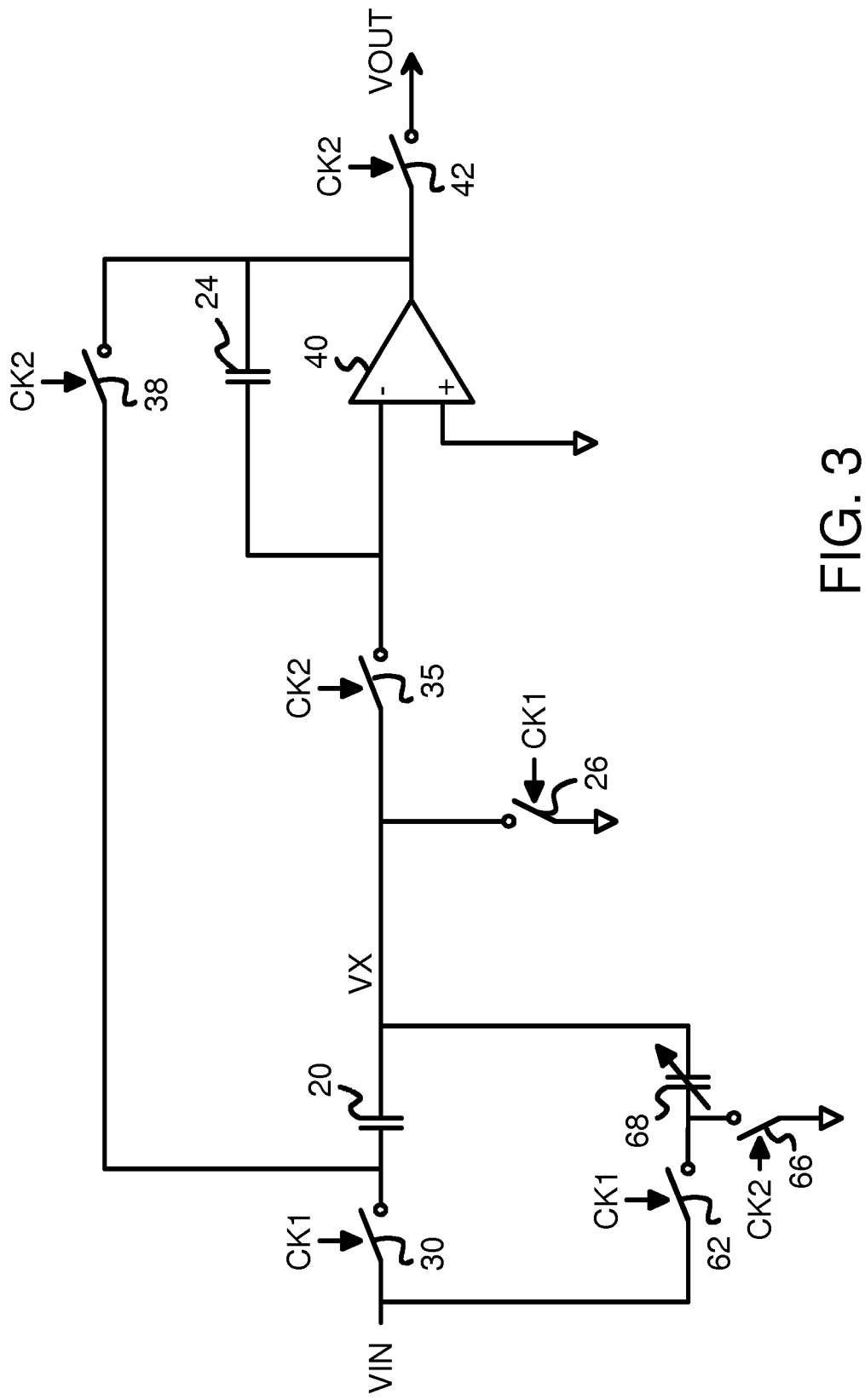
FIG. 3 is a diagram of a Programmable-Gain Amplifier (PGA) with a variable capacitor.

FIG. 3 is a diagram of a Programmable-Gain Amplifier (PGA) with a variable capacitor. Input voltage VIN is sampled during a first phase by clock CK1, which closes switch 30 to charge sampling capacitor 20. The other plate of sampling capacitor 20 at node VX is connected to virtual ground by grounding switch 26 which is also closed by CK1.

Variable gain capacitor 68 has a variable capacitance that has a capacitance value that is controlled by a digital value. Variable gain capacitor 68 samples input voltage VIN through switch 62 which is also closed during the first phase by clock CK1. The other plate of variable gain capacitor 68 at node VX is connected to virtual ground by grounding switch 26 which is also closed by CK1.

During the second phase, CK2 is active and CK1 is inactive. Switches 30, 62, 26 open while switches 35, 38, 42 are closed by CK2. The charges stored on sampling capacitor 20 and variable gain capacitor 68 on node VX are applied to the inverting (−) input of amplifier 40 through switch 35. The non-inverting input of amplifier 40 is connected to virtual ground.

Switch 38 is closed by CK2 to place sampling capacitor 20 in parallel with feedback capacitor 24, as both are connected between the inverting input of amplifier 40 and its output. However, variable gain capacitor 68 is not connected in parallel with feedback capacitor 24. Instead, switch 66 connects the input-side plate of variable gain capacitor 68 to virtual ground, rather than to the output of amplifier 40. Variable gain capacitor 68 allows the gain of the circuit of FIG. 3 to be adjusted as the capacitance value of variable gain capacitor 68 is adjusted since the capacitance value of variable gain capacitor 68 appears in the numerator of the transfer function equation for the circuit.

Output switch 42 is closed by clock CK2 to allow output voltage VOUT to be charged or discharged by the output of amplifier 40. Direct charge transfer may also occur through switch 38 where charge is transferred directly from sampling capacitor 20 to output VOUT.

Figure 4:
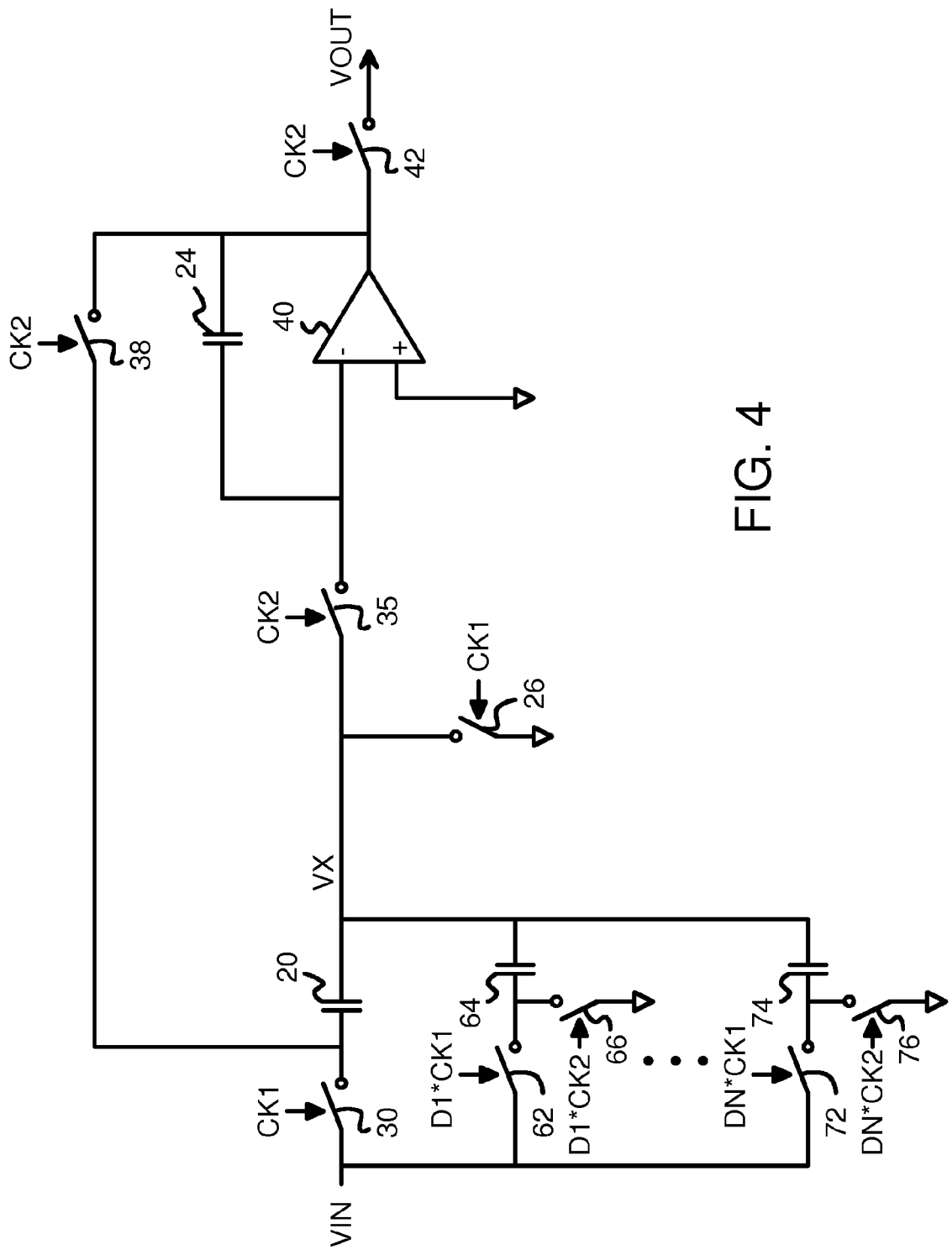
FIG. 4 shows a Programmable-Gain Amplifier (PGA) with a digitally-controlled variable capacitance that sets the amplifier gain.

FIG. 4 shows a Programmable-Gain Amplifier (PGA) with a digitally-controlled variable capacitance that sets the amplifier gain. An N-bit digital value D1, D2, D3, . . . DN controls the amount of capacitance for the variable gain capacitor. Variable-gain sub-capacitor 64 is enabled when D1 is high, but disabled when D1 is low. When D1 is high, switch 62 connects one plate of variable-gain sub-capacitor 64 to input VIN when CK1 is high. This plate of variable-gain sub-capacitor 64 is connected to virtual ground by switch 66 when CK2 is high. When D1 is low, both switches 62, 66 remain open, regardless of CK1 or CK2.

Similarly, variable-gain sub-capacitor 74 is enabled when DN is high, but disabled when DN is low. When DN is high, switch 72 connects one plate of variable-gain sub-capacitor 74 to input VIN when CK1 is high. This plate of variable-gain sub-capacitor 74 is connected to virtual ground by switch 76 when CK2 is high. When DN is low, both switches 72, 76 remain open, regardless of CK1 or CK2.

Other variable-gain sub-capacitors and switches exist for bits D2, D3, . . . D(N−1) but are not shown. Each variable-gain sub-capacitor 64 . . . 74 could have the same capacitance value, or the capacitance values could be in a sequence such as binary-weighted. Thus the digital value D1 . . . DN determines the amount of capacitance enabled as the variable gain capacitor. Other components shown in FIG. 3 operate as described for FIG. 3.

Figure 5A:
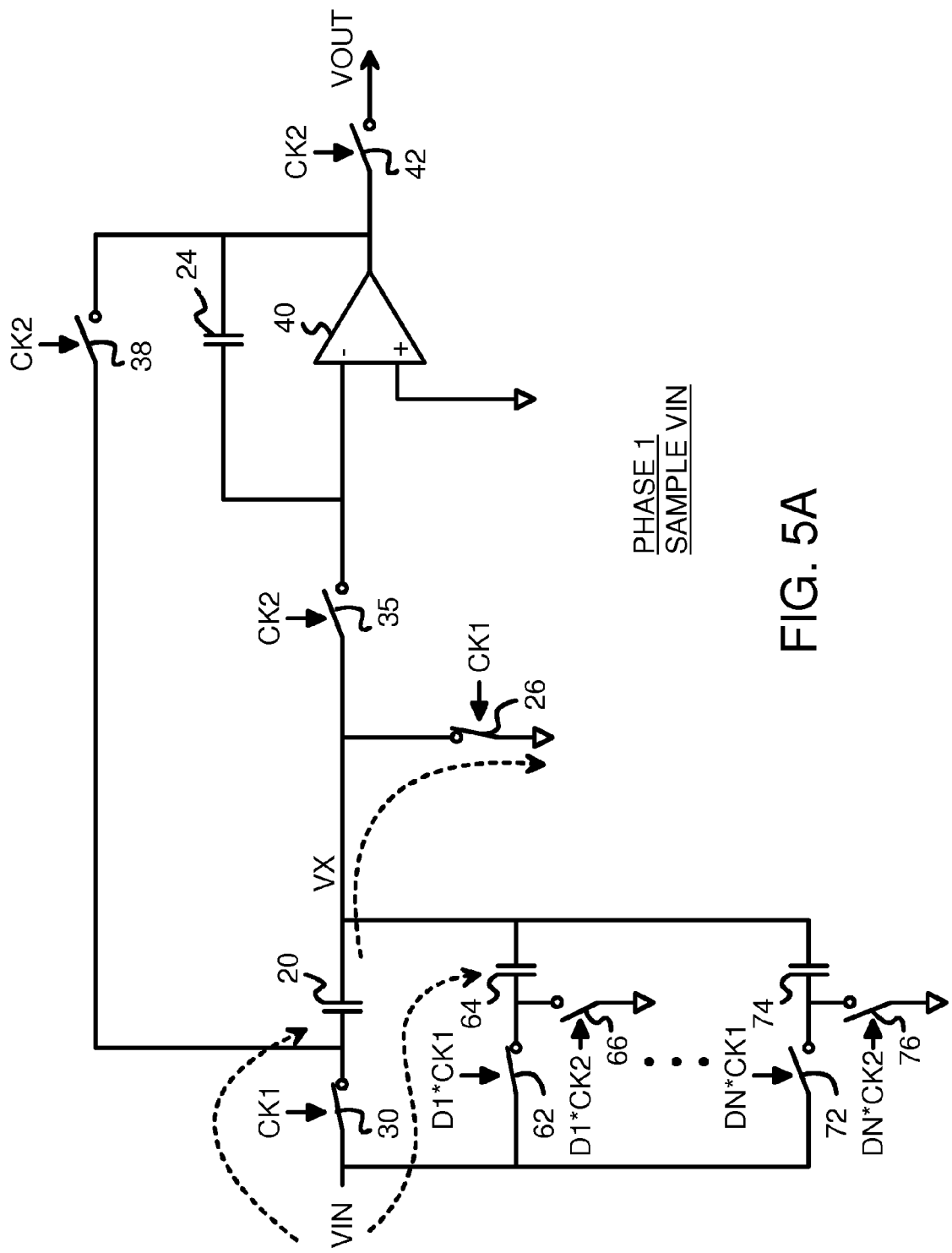
FIGS. 5A-B show two-phase operation of the Programmable-Gain Amplifier (PGA) with digitally-controlled variable capacitance that sets the amplifier gain.
Figure 5B:
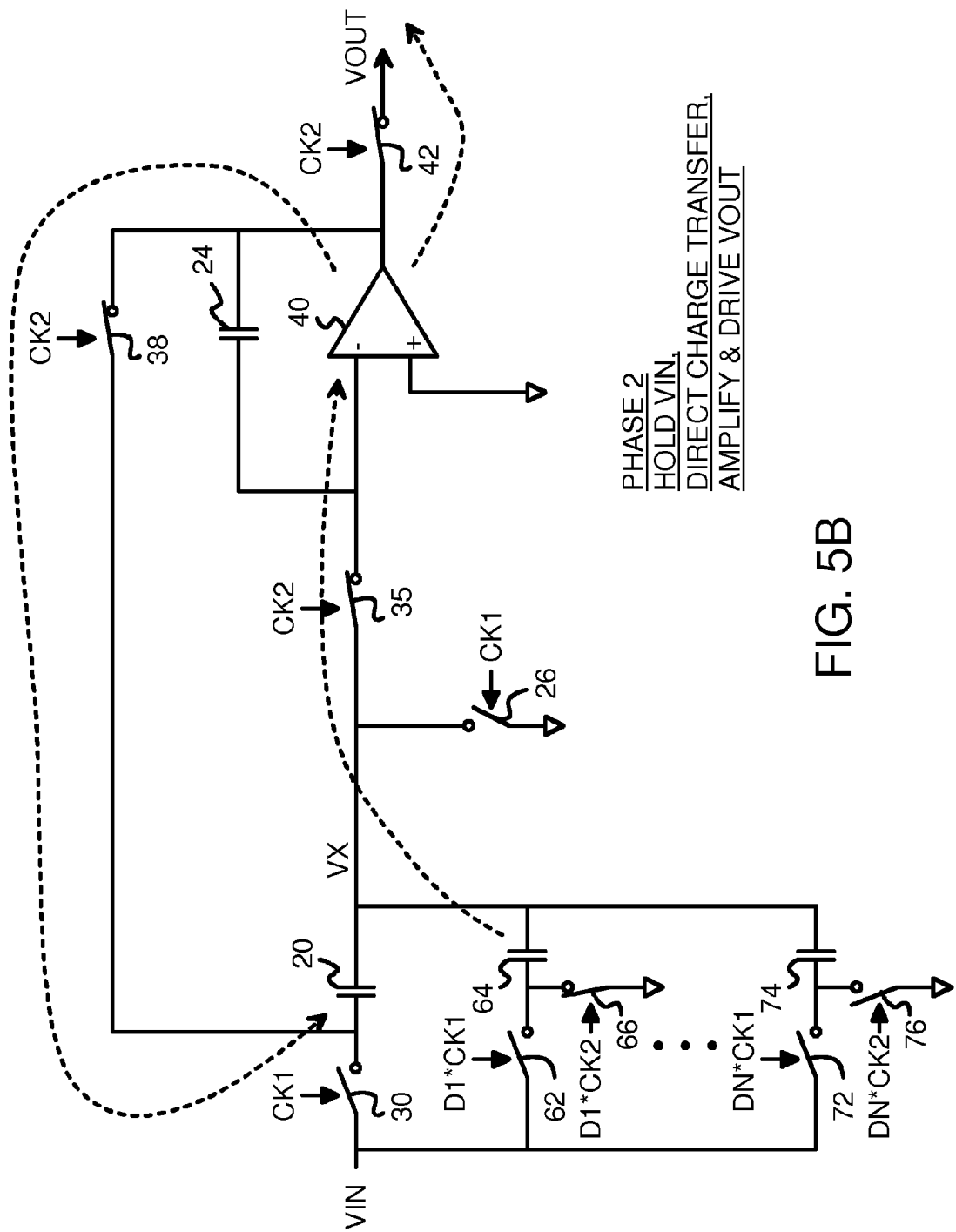

FIGS. 5A-B show two-phase operation of the Programmable-Gain Amplifier (PGA) with digitally-controlled variable capacitance that sets the amplifier gain. In FIG. 5A, the first phase is shown, when clock CK1 is high (active) and CK2 is low (inactive). During the first phase, input VIN is sampled. Since CK2 is low, switches 35, 38, 42 are open. Also, all of switches 66, . . . 76 are open since CK2 is low and the product with any digital value D1, D2, . . . DN is also low.

Assume that D1 is high and DN is low for the digital input value. DN low causes both of switches 72, 76 to remain open, so that the capacitance of variable-gain sub-capacitor 74 does not contribute to the amplifier gain as no charge is transferred from variable-gain sub-capacitor 74.

However, D1 high allows switch 62 to close during the first phase when CK1 is high. Input charge from VIN flows through switch 62 to charge variable-gain sub-capacitor 64. Thus the capacitance of variable-gain sub-capacitor 64 contributes to the amplifier gain since its charge is transferred from VIN.

CK1 high also closed switch 30, allowing input charge from VIN to charge sampling capacitor 20. Grounding switch 26 is also closed by CK1 high, grounding the right plates of sampling capacitor 20 and any of variable-gain sub-capacitors 64, . . . 74 that are enabled. Thus input charge from VIN is sampled and stored onto sampling capacitor 20 and any of variable-gain sub-capacitors 64, . . . 74 that are enabled.

In FIG. 5B, the second phase is shown, when clock CK2 is high (active) and CK1 is low (inactive). During the second phase, the sampled input VIN that is stored on sampling capacitor 20 and any of variable-gain sub-capacitors 64, . . . 74 that are enabled are amplified by amplifier 40 to drive output VOUT.

Since CK1 is low during the second phase, switches 30, 26 are open. Also, all of switches 62, . . . 72 are open since CK1 is low and the product with any digital value D1, D2, . . . DN is also low.

Switch 35 is closed by CK2 high, allowing the stored charge on node VX to be applied to the inverting input of amplifier 40. Again assuming that D1 is high and DN is low for the digital input value, DN low causes both of switches 72, 76 to remain open, so that the capacitance of variable-gain sub-capacitor 74 does not contribute to the amplifier gain as no charge is transferred from variable-gain sub-capacitor 74.

However, D1 high allows switch 66 to close during the second phase when CK2 is high. Stored charge on variable-gain sub-capacitor 64 is pushed onto node VX as the left side of variable-gain sub-capacitor 64 is connected to virtual ground. Thus the capacitance of variable-gain sub-capacitor 64 contributes to the amplifier gain since its stored charge is transferred to amplifier 40.

Other grounding switches 66, . . . 76 are also closed by CK2 high, grounding the left plates of any of variable-gain sub-capacitors 64, . . . 74 that are enabled. Thus input charge stored on any of variable-gain sub-capacitors 64, . . . 74 that are enabled are applied to the input of amplifier 40.

The left plate of sampling capacitor 20 is not connected to virtual ground during the second phase. Instead, this left plate of sampling capacitor 20 is connected through to the output of amplifier 40 through switch 38. Switches 38, 35 are closed by CK2 high during the second phase. Thus sampling capacitor 20 is connected between the inverting input and the output of amplifier 40 during the second phase. This allows for direct charge transfer between the output of amplifier 40 and the input (left) plate of sampling capacitor 20.

Sampling capacitor 20 is connected in parallel with feedback capacitor 24 during the second phase. However, variable-gain sub-capacitors 64, . . . 74 are not connected in parallel with feedback capacitor 24 but instead are connected as input capacitors. Switch 42 is also closed by CK2 high, allowing the output of amplifier 40 to drive output VOUT.

The transfer function for the amplifier circuit of FIG. 4 is:

$$V\text{out}(z)/V\text{in}(z) = (1+Cg/Cs)z^{-1/2}/[(1+Cfb/Cs)-(Cfb/Cs)z^{-1}]$$

where Cs is the capacitance of sampling capacitor 20, Cfb is the capacitance of feedback capacitor 24, and Cg is the sum of capacitances of any of variable-gain sub-capacitors 64, . . . 74 that are enabled by D1, D2, . . . DN. The gain is given by (1+Cg/Cs). Thus Cg, the capacitance of the variable gain capacitor, directly controls the amplifier gain.

Figure 6:
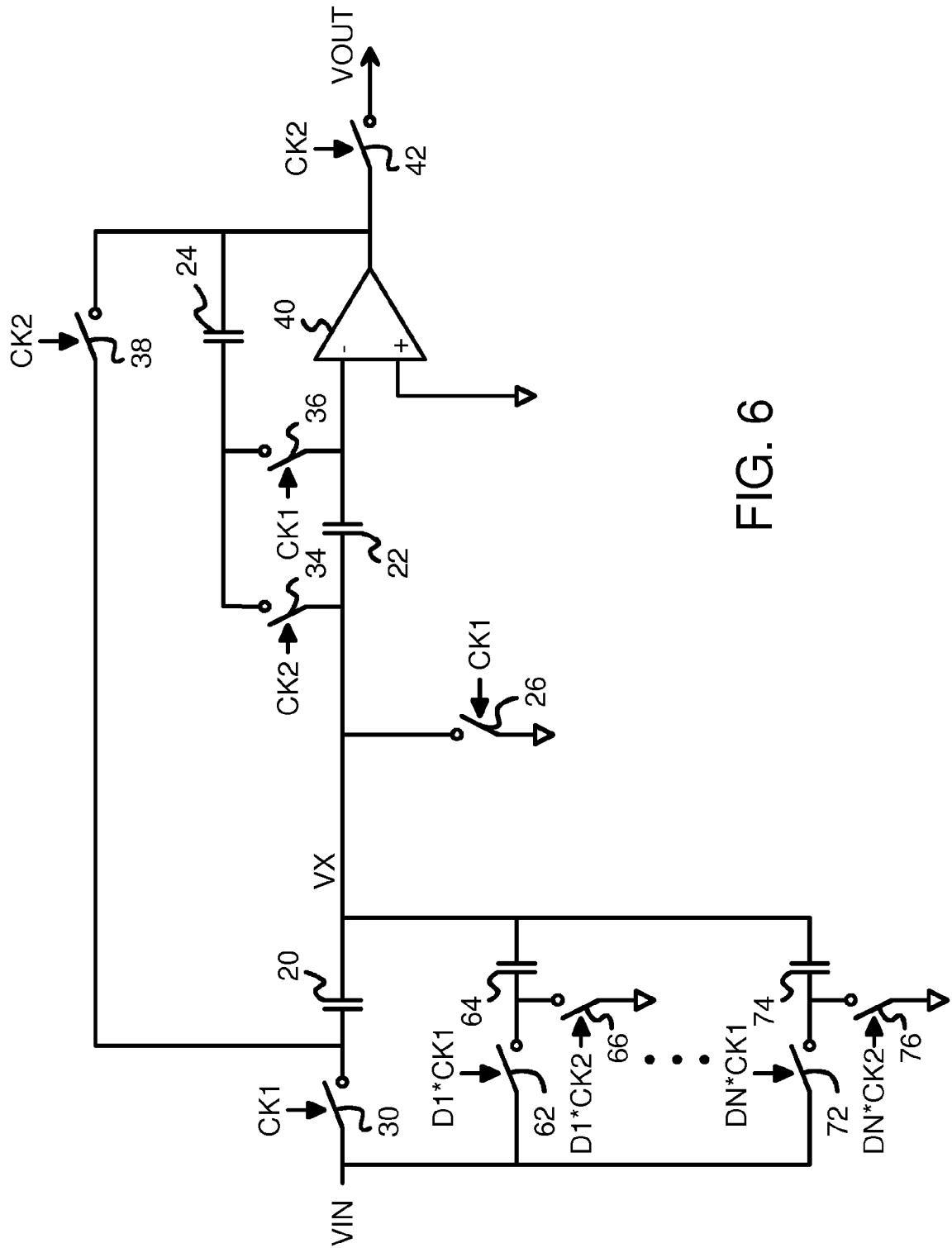
FIG. 6 shows a Programmable-Gain Amplifier (PGA) with a variable gain capacitor and correlated double-sampling to cancel offset and noise.

FIG. 6 shows a Programmable-Gain Amplifier (PGA) with a variable gain capacitor and correlated double-sampling to cancel offset and noise. Double-sampling capacitor 22 is inserted before the inverting input of amplifier 40. Amplifier input offset and noise is stored on double-sampling capacitor 22.

Node VX connects to the left plate of double-sampling capacitor 22, while the right plate of double-sampling capacitor 22 connects to the inverting (−) input of amplifier 40. The left plate of feedback capacitor 24 connects to the inverting input of amplifier 40 through switch 36, which closes during the first phase when CK1 is high. During the second phase when CK2 is high, the left plate of feedback capacitor 24 connects to node VX through switch 34. Other components are as described for FIG. 4.

Figure 7A:
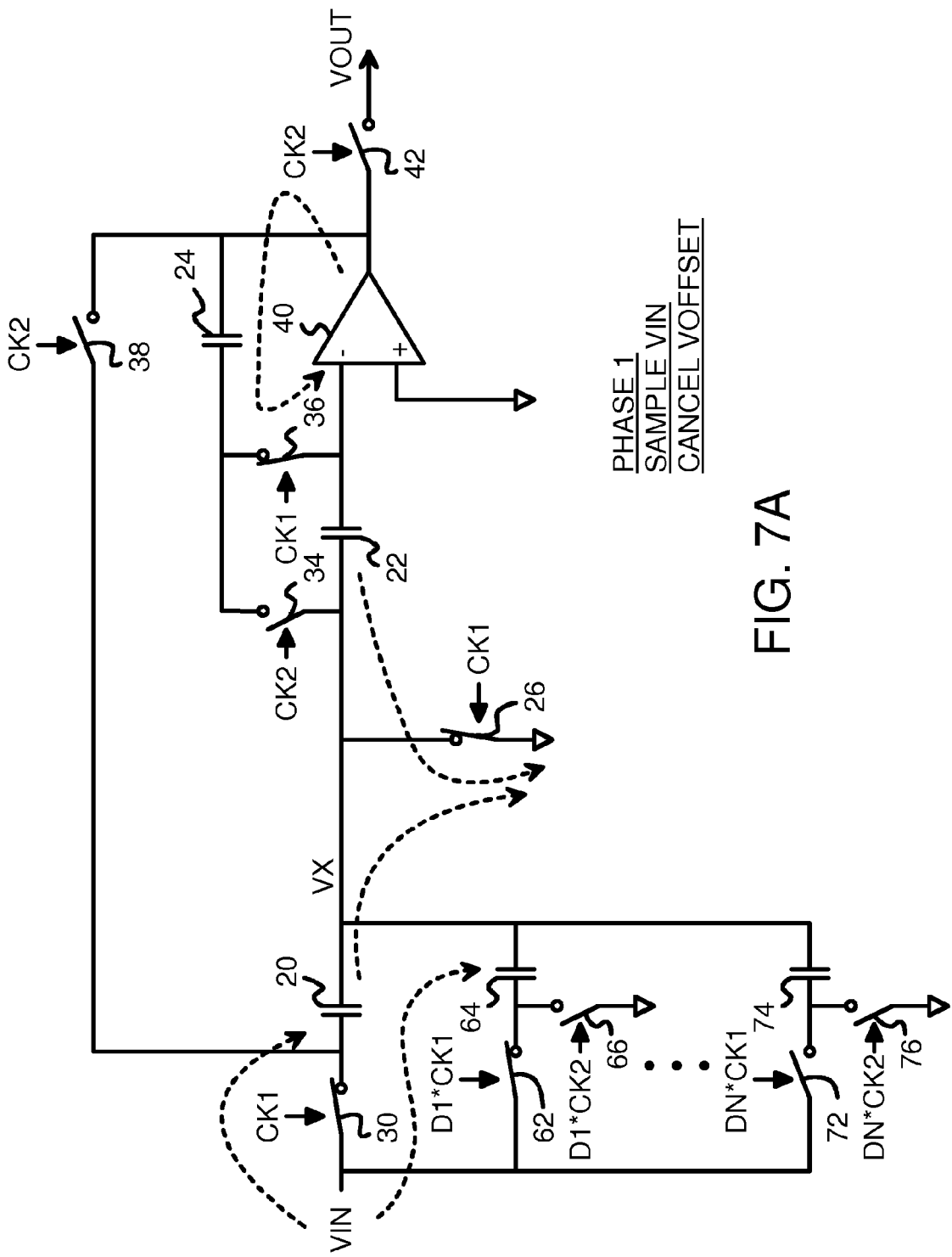
FIGS. 7A-B show double-sampling of the Programmable-Gain Amplifier (PGA) with digitally-controlled variable capacitance.
Figure 7B:
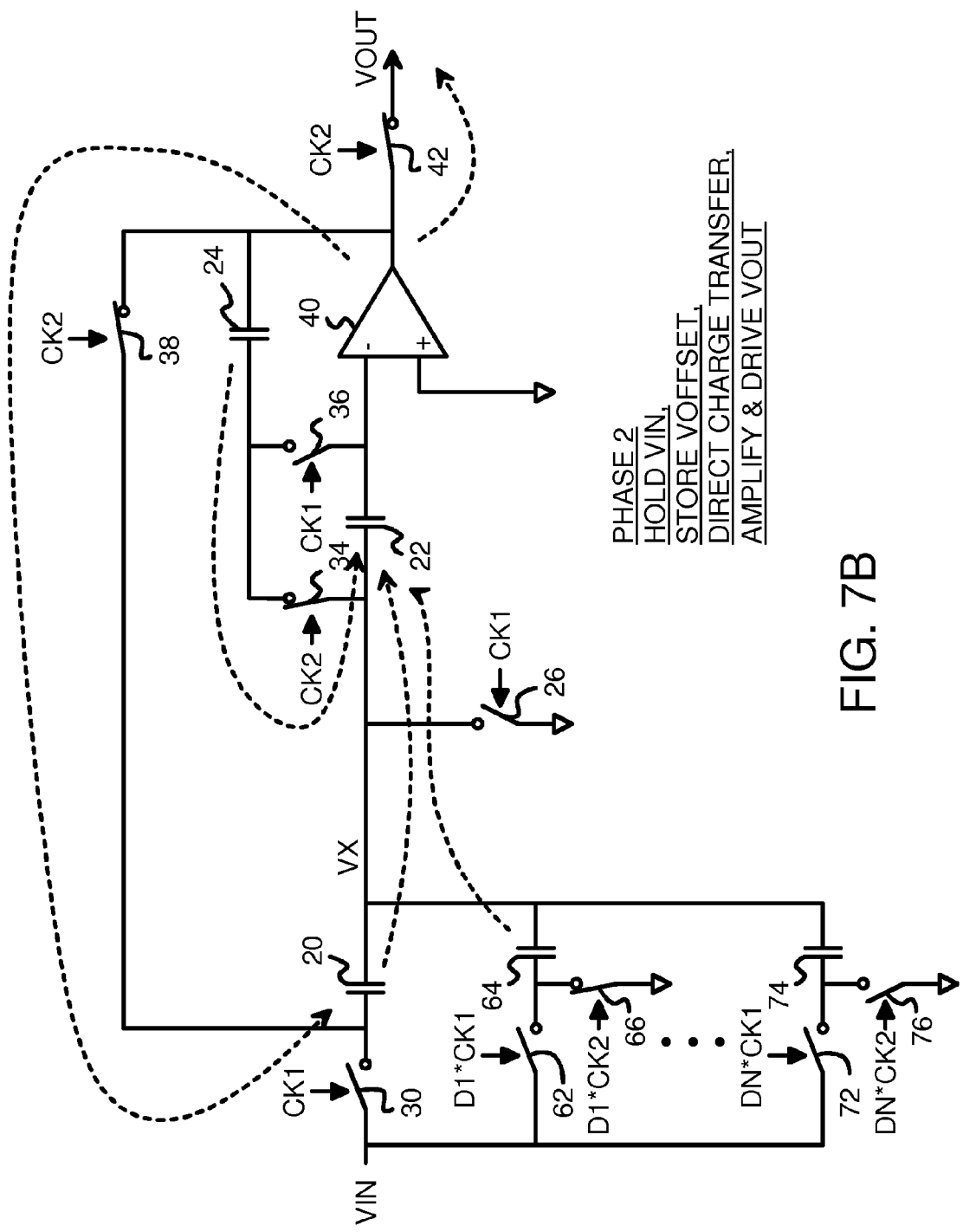

FIGS. 7A-B show double-sampling of the Programmable-Gain Amplifier (PGA) with digitally-controlled variable capacitance. In FIG. 7A, the first phase is shown, when clock CK1 is high (active) and CK2 is low (inactive). During the first phase, input VIN is sampled. Since CK2 is low, switches 34, 35, 38, 42 are open. Also, all of switches 66, ... 76 are open since CK2 is low and the product with any digital value D1, D2, ... DN is also low.

Since CK1 is high, switch 36 is closed, allowing feedback capacitor 24 to transfer a small offset voltage or charge to the right plate of double-sampling capacitor 22. The left plate of double-sampling capacitor 22 is connected to virtual ground by grounding switch 26. Thus an offset charge is stored on double-sampling capacitor 22 during the first phase. Any noise or input offsets from earlier cycles are reset by grounding switch 26 discharging the left plate of double-sampling capacitor 22. Thus offsets do not accumulate over many cycles of CK1, CK2.

Input charge from VIN is sampled and stored onto sampling capacitor 20 and any of variable-gain sub-capacitors 64, ... 74 that are enabled as described earlier for FIG. 5A.

In FIG. 7B, the second phase is shown, when clock CK2 is high (active) and CK1 is low (inactive). Since CK1 is low during the second phase, switches 30, 26, 36 are open. Also, all of switches 62, ... 72 are open since CK1 is low and the product with any digital value D1, D2, ... DN is also low.

During the second phase, the sampled input charge that is stored on sampling capacitor 20 and any of variable-gain sub-capacitors 64, ... 74 that are enabled are amplified by amplifier 40 to drive output VOUT as described earlier for FIG. 5B.

Rather than connect directly to the inverting input of amplifier 40, the right plates of sampling capacitor 20 and any of enabled variable-gain sub-capacitors 64, ... 74 drive node VX, which is the left plate of double-sampling capacitor 22. Any stored offset charge that was stored on double-sampling capacitor 22 during the first phase is added to the stored input charges, and the right plate of double-sampling capacitor 22 then drives the inverting input of amplifier 40. Thus both the stored VIN input charges on sampling capacitor 20 and any of enabled variable-gain sub-capacitors 64, ... 74 are passed through double-sampling capacitor 22, which adds the offset charge.

Switch 34 is closed by CK2 high, allowing the left plate of feedback capacitor 24 to connect to the left plate of double-sampling capacitor 22. Thus sampling capacitor 20 and feedback capacitor 24 are still connected in parallel, between the output of amplifier 40 and node VX.

Figure 8:
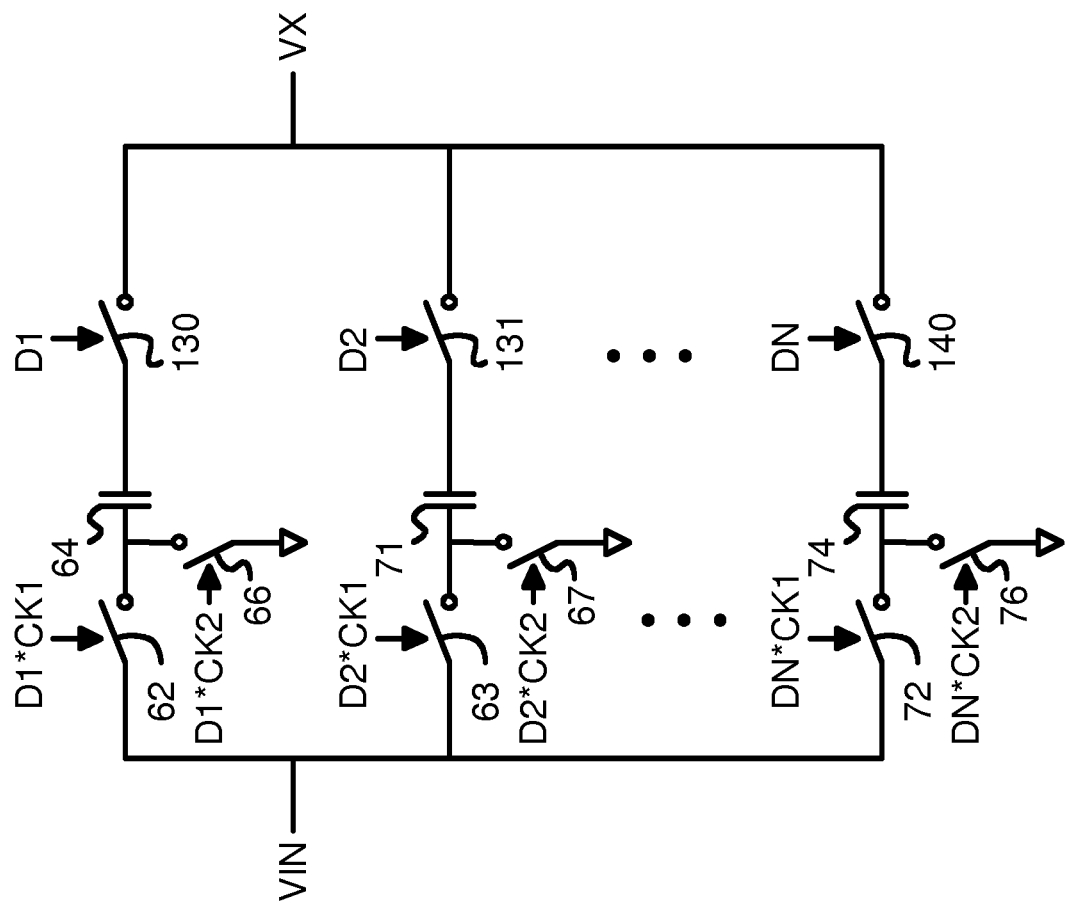
FIG. 8 shows a variable capacitor with reduced parasitic capacitance.

FIG. 8 shows a variable capacitor with reduced parasitic capacitance. Variable gain capacitor 68 of FIG. 3 may be implemented by several variable-gain sub-capacitors 64, ... 74 that have input switches 62, ... 72 and grounding switches 66, ... 76 as shown in FIGS. 4-7.

In the embodiments of FIGS. 4-7, the capacitance of any of variable-gain sub-capacitors 64, ... 74 that are not enabled do not contribute to the A.C. capacitance value or to the amplifier gain, but the right plate of non-selected variable-gain sub-capacitors 64, ... 74 do add D.C. capacitance to node VX. This D.C. capacitance may be considered a parasitic capacitance that may degrade performance somewhat.

In FIG. 8, another embodiment of the variable gain capacitor is shown. variable-gain sub-capacitors 64, 71, ... 74 are each enabled or disabled by a digital bit D1, D2, ... DN. Additional isolating switches 130, 131, ... 140 are inserted between the right plates of variable-gain sub-capacitors 64, 71, ... 74 and node VX. These isolating switches are open when the corresponding digital bit is low, thus removing the parasitic capacitance from node VX when the bit turns off the variable-gain sub-capacitor.

For example, when D2 is low, variable-gain sub-capacitor 68 is disconnected from node VX by isolating switch 131. Isolating occurs for both phases, regardless of CK1 and CK2. Switches 63, 67 also remain open when D2 is low.

When D2 is high, the right plate of variable-gain sub-capacitor 71 is connected to node VX by isolating switch 131. Switch 63 closes when CK1 is high, while switch 67 closes when CK2 is high. Thus VIN is sampled during CK1 and the sampled charge on variable-gain sub-capacitor 71 is pushed to node VX when CK2 is high.

Figure 9:
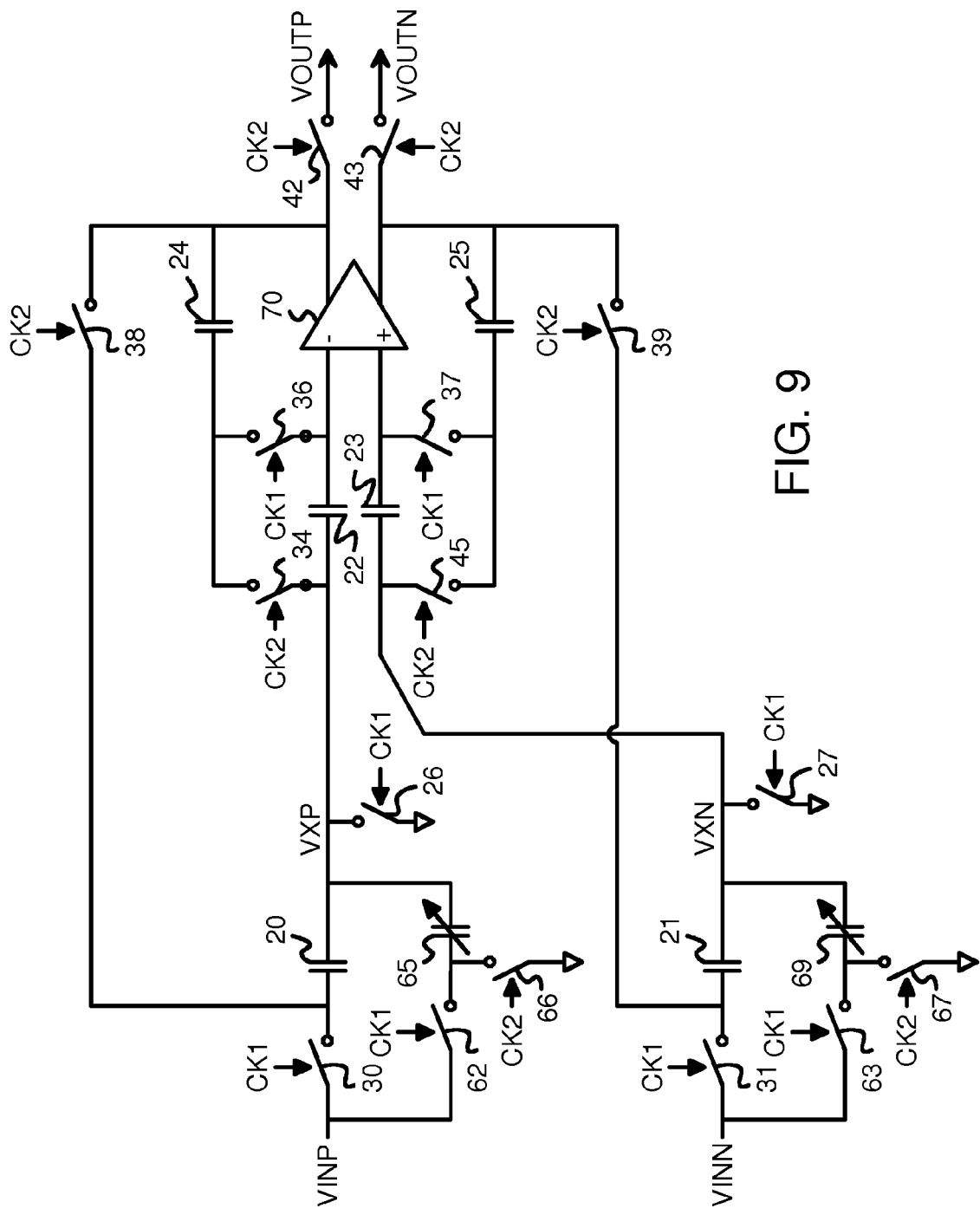
FIG. 9 is a diagram of a differential Programmable-Gain Amplifier (PGA) with variable capacitors for gain control.

FIG. 9 is a diagram of a differential Programmable-Gain Amplifier (PGA) with variable capacitors for gain control. Some applications may have a fully differential input VINP, VINN and a fully differential output VOUTP, VOUTN. Differential amplifier 70 has a differential output as well as a differential input. The output polarities may be swapped in some embodiments.

A second circuit similar to that of FIG. 6 is applied to the non-inverting input of differential amplifier 70. A digital gain value such as D1, D2, ... DN can be applied to variable-gain sub-capacitors in variable gain capacitor 65 for the P circuit that connects to the inverting input of differential amplifier 70. The same digital gain value can be applied to variable-gain sub-capacitors in variable gain capacitor 69 for the N circuit that connects to the non-inverting input of differential amplifier 70.

Input VINP is sampled by sampling capacitor 20 through switch 30 and by variable gain capacitor 65 through switch 62 when CK1 is high. Node VXP is grounded by switch 26 by CK1. Switch 36 connects feedback capacitor 24 to the right plate of double-sampling capacitor 22 when CK1 is active.

When CK2 is active, the VOUTP output is driven through switch 42 from differential amplifier 70 and connects through switch 38 to sampling capacitor 20. Switch 66 grounds the left side of variable gain capacitor 65 and switch 34 closes to drive the left plate of double-sampling capacitor 22, while the right plate of double-sampling capacitor 22 drives the inverting input of differential amplifier 70.

For the N circuit, Input VINN is sampled by sampling capacitor 21 through switch 31 and by variable gain capacitor 69 through switch 63 when CK1 is high. Node VXN is grounded by switch 27 by CK1. Switch 37 connects feedback capacitor 25 to the right plate of double-sampling capacitor 23 when CK1 is active.

When CK2 is active, the VOUTN output is driven through switch 43 from differential amplifier 70 and connects through switch 39 to sampling capacitor 21. Switch 67 grounds the left side of variable gain capacitor 69 and switch 45 closes to drive the left plate of double-sampling capacitor 23, while the right plate of double-sampling capacitor 23 drives the inverting input of differential amplifier 70.

Figure 10A:
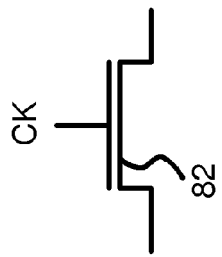
FIGS. 10A-C show that switches may be implemented as n-channel transistors, p-channel transistors, or transmission gates with parallel n-channel and p-channel transistors.
Figure 10B:
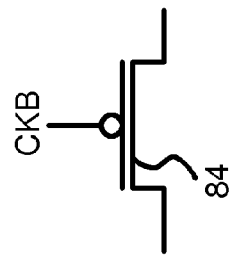
Figure 10C:
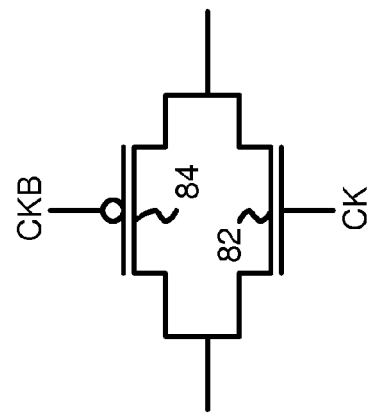

FIGS. 10A-C show that switches may be implemented as n-channel transistors, p-channel transistors, or transmission gates with parallel n-channel and p-channel transistors. FIG. 10A shows n-channel transistor 82 with a gate receiving the clock signal CK, such as CK1 for switch 30 in FIG. 3. When CK is high, n-channel transistor 82 closes the drain to source connection, allowing current flow and connecting together the two terminals. When CK is low, n-channel transistor 82 opens the drain to source connection, blocking current flow and isolating the two terminals.

FIG. 10B shows p-channel transistor 84 with a gate receiving the clock signal CKB, such as the inverse of CK1 for switch 30 in FIG. 3. When CK is high, CKB is low, p-channel transistor 84 closes the drain to source connection, allowing current flow and connecting together the two terminals. When CK is low, CKB is high, p-channel transistor 84 opens the drain to source connection, blocking current flow and isolating the two terminals.

FIG. 10C shows a transmission gate with n-channel transistor 82 with a gate receiving CK, and p-channel transistor 84 with a gate receiving the inverse clock signal CKB, such as the inverse of CK1 for switch 30 in FIG. 3. The source of n-channel transistor 82 is connected to the drain of p-channel transistor 84, and the drain of n-channel transistor 82 is connected to the source of p-channel transistor 84. The terms source and drain are interchangeable since they depend on the voltage biases applied.

When CK is high, n-channel transistor 82 closes the drain to source connection, allowing current flow and connecting together the two terminals. Also, CKB is low, so p-channel transistor 84 closes the drain to source connection, allowing current flow and connecting together the two terminals.

When CK is low, n-channel transistor 82 opens the drain to source connection, blocking current flow and isolating the two terminals. Also, CKB is high, so p-channel transistor 84 opens the drain to source connection, blocking current flow and isolating the two terminals.

The bulk or substrate terminal of n-channel transistor 82 can be connected to the lowest available voltage, such as ground when the midpoint is VDD/2, or to an average of the negative peak voltages, or to a substrate bias voltage VBB. Similarly, the bulk or substrate terminal of p-channel transistor 84 can be connected to the highest available voltage, such as VDD.

ALTERNATE EMBODIMENTS

Several other embodiments are contemplated by the inventors. For example various combinations of the embodiments shown are contemplated. While an application of a PGA for an AFE has been shown, other applications may use the PGA with a variable capacitor that sets the gain. While an AFE for receiving signals from electrodes that pick up an ECG have been shown, other signals, sensors, and applications may be substituted, such as for Electromyography (EMG), Electroencephalography (EEG), Electro-Oculography (EOG), etc. The low power and cost of the circuit is ideally suited for wearable devices with an AFE, such as pulse monitors, respiration monitors, oxygen saturation (SpO2) monitors, acceleration or Gravity (G-force) monitors or sensors, gyroscopes, etc. The circuit could also be used for Radio-Frequency (RF) front ends rather than AFE's, such as for Near-Field Communication (NFC) devices or Radio-Frequency Identification (RFID) devices where a variable gain is desired.

Using double-sampling capacitor 22 has the benefit of reducing or canceling noise or offsets. Offsets may be reduced by large amounts, such as by a factor of 20, and input referred noise may be reduced by a factor of 4 or more. However, using correlated double-sampling as shown in FIGS. 6-7 is not required, and some embodiments, such as that shown in FIGS. 4-5 may not use double-sampling, or may use another form of offset cancellation. A stable amplifier circuit may be obtained with a relatively small number of capacitors and other components, reducing die area and cost, and saving power. An analog input may be directly filtered even though the variable gain capacitor has a digital control value. The digital value may be changed or adjusted when a different gain is desired, or may be fixed once the desired gain is obtained, such as by testing a prototype in a desired application.

Direct charge transfer through switch 38 (FIG. 6) allows charge to be shared between sampling capacitor 20 and feedback capacitor 24 which are connected in parallel when switches 34, 38 are closed. Direct charge transfer reduces the current required from the output of amplifier 40, thus reducing power consumption. The circuit is naturally dampened as an inherently stable first order low-pass filter.

Amplifier 40 and differential amplifier 70 may be op amps, differential amps, difference amps, complementary metal-oxide-semiconductor (CMOS) current-mirrored amps, etc. A variety of circuits may be used to implement amplifiers. Current-gain or voltage-gain amplifiers may be used.

Figure 11:
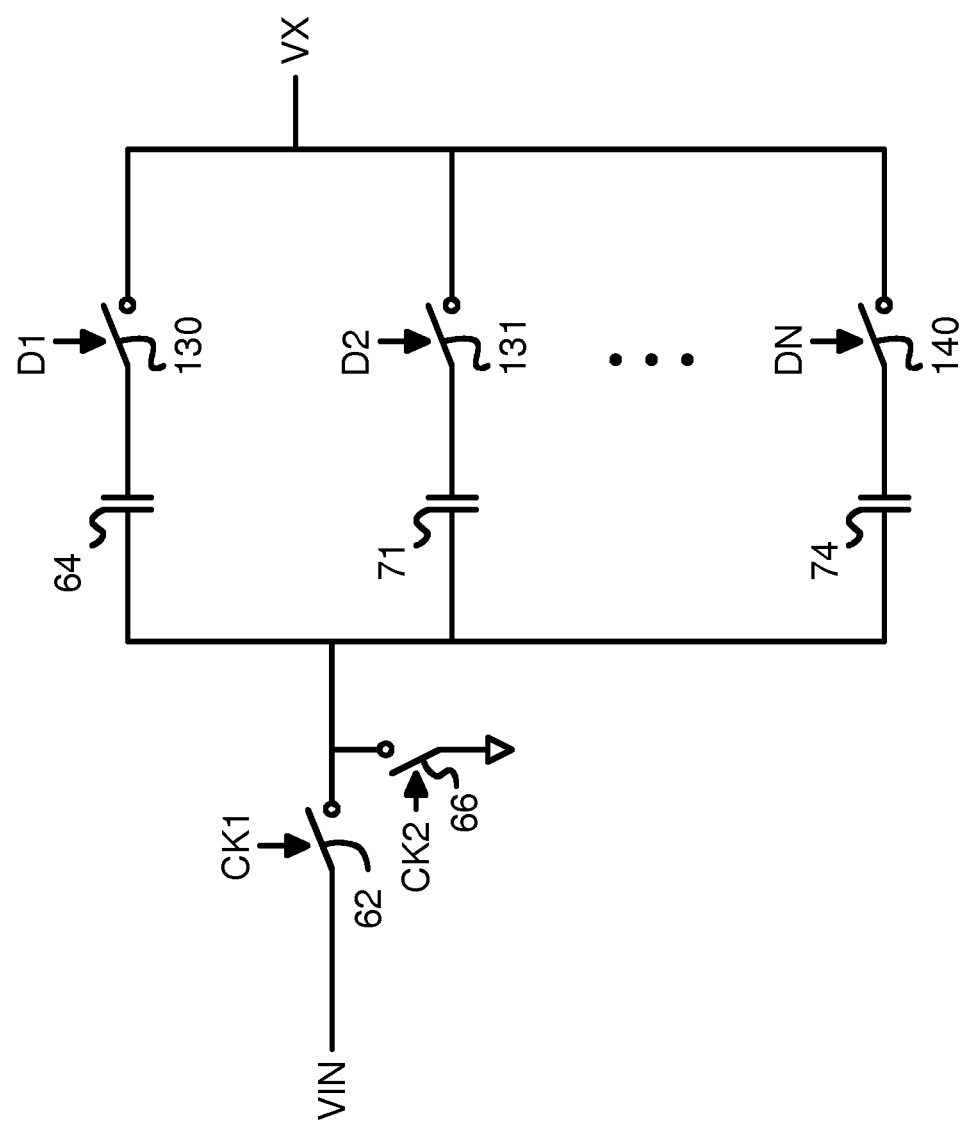
FIG. 11 shows another alternative to the variable capacitor of FIG. 8.

Any of variable-gain sub-capacitors 64, . . . 74 that are not enabled may be completely isolated from node VX by an isolating switch such as switch 130 in FIG. 8, or may have their right plates remain connected to node VX, such as shown in FIG. 6. The left plates of any of variable-gain sub-capacitors 64, . . . 74 that are disabled may be left floating, such as when switches 72, 76 are left open by DN being low, or may be held to a fixed voltage such as virtual ground by closing switch 76 for both disabled and enabled variable-gain sub-capacitors, either during CK2 or all the time. FIG. 11 shows another alternative to the variable capacitor of FIG. 8. Switches 62, 66 are shared by all sub-capacitors 64, 71, . . . 74. The control signals to switches 62, . . . 72 could be modified, such as being CK2 rather than CK2 AND DN, or could have some other logical control term.

The multi-bit digital value may be encoded and then decoded into separate control bits D1, D2, D3, . . . DN. Many encodings or compression functions may be used. Programmable registers may store the encoded multi-bit digital value or a decoded multi-bit digital value.

Grounds may be virtual grounds that have a voltage other than zero volts, or A.C. grounds. A fixed voltage such as a midpoint in an input-voltage swing may be applied as the virtual ground. This voltage may be approximate, such as VDD/2, or may be variable, such as a voltage generated by a filtering capacitor that filters or swings in the input voltage to obtain an average input voltage.

A filter capacitor could be added to VOUT to maintain VOUT during the first phase when switch 42 is open. Parasitic capacitance on VOUT could also be used for this purpose. Isolating switches 130, 131, . . . 140 may be added to some but not all variable-gain sub-capacitors 64, 71, . . . 74. For example, large-value sub-capacitors could have isolating switches while small sub-capacitors with tiny capacitances could eliminate the isolating switches.

Capacitors may be transistors with sources and drains connected together as one capacitor terminal, and the gate as the second capacitor terminal. Other kinds of capacitors could be used, such as a Metal-Insulator-Metal (MIM) capacitor or a Metal-Oxide-Metal (MoM) capacitor or Metal-Metal or Poly-Poly or Metal-Poly or other off-chip capacitors such as a ceramic capacitor or a thin-film capacitor or a polyester capacitor.

Some embodiments may not use all components. For example, switches may be added or deleted in some embodiments. Different kinds of switches may be used, such as 2-way switches or 3-way switches. Muxes may be used as switches. Input or output resistors could be added, or input or output filters used. Inversions may be added by swapping inverting and non-inverting inputs as desired, but do not change the overall function and thus may be considered equivalents. Clocks may be inverted to drive the gates of p-channel transistors. Active-low clocks could be used that have non-overlapping low-going pulses rather than non-overlapping high-going pulses.

Capacitors, resistors, and other filter elements may be added. Switches could be n-channel transistors, p-channel transistors, or transmission gates with parallel n-channel and p-channel transistors, or more complex circuits, either passive or active, amplifying or non-amplifying. External switches such as relays could also be used.

Additional components may be added at various nodes, such as resistors, capacitors, inductors, transistors, extra buffering, etc., and parasitic components may also be present. Enabling and disabling the circuit could be accomplished with additional transistors or in other ways. Pass-gate transistors or transmission gates could be added for isolation.

The final sizes of transistors, capacitors, and other components may be selected after circuit simulation or field testing. Metal-mask options or other programmable components may be used to select the final transistor sizes. Transistors may be connected together in parallel to create larger transistors that have the same fringing or perimeter effects across several sizes. Currents may be positive currents or negative currents that flow in an opposite direction. Charging of a capacitor may be charging with positive charge or charging with negative charge. Thus the terms charging and discharging can be with respect to current in either direction, or with either positive or negative charges. The terms left plates and right plates are with reference to the diagrams and not necessarily to the physical device orientations. Peaks in a signal may be positive peaks or negative peaks (troughs).

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching.

It is intended that the scope of the invention be limited not by this detailed description, but rather by the claims appended hereto.

We claim:

1. A direct-charge-transfer switched-capacitor circuit having an amplifier gain that is digitally programmable comprising:
    a digital input having a multi-bit digital value that is programmable to vary a gain of the direct-charge-transfer switched-capacitor circuit;
    an analog input;
    an op amp having a first input and a second input and an output;
    a sampling capacitor for storing sampled input charge that is sampled from the analog input during a first clock phase;
    a feedback capacitor that is connected to the output of the op amp and in parallel with the sampling capacitor during a second clock phase for direct charge transfer;
    a parallel capacitor network having a plurality of sub-capacitors that are enabled and disabled by the multi-bit digital value of the digital input;
    wherein a capacitance value of the parallel capacitor network is a sum of capacitance values of sub-capacitors that are enabled by the multi-bit digital value, wherein the parallel capacitor network has a variable capacitance that depends on the multi-bit digital value;
    wherein the plurality of sub-capacitors that are enabled sample the analog input during the first clock phase and drive stored sampled input charge to the first input of the op amp during the second clock phase; and
    a double-sampling capacitor connected between the plurality of sub-capacitors and the first input of the op amp, wherein the stored sampled input charge is driven to double-sampling capacitor and charge is coupled through the double-sampling capacitor to the first input of the op amp during the second clock phase.

2. The direct-charge-transfer switched-capacitor circuit of claim 1 further comprising:
    a summing node between the parallel capacitor network, the sampling capacitor, and the double-sampling capacitor;
    a summing grounding switch that connects the summing node to a virtual ground in response to the first clock phase;
    a connecting switch that connects the summing node to a feedback node that is connected to the feedback capacitor in response to the second clock phase; and
    an offset switch that connects the feedback node to the first input of the op amp in response to the first clock phase.

3. A Programmable-Gain Amplifier (PGA) comprising:
    an amplifier having a first input and a second input and an output;
    a sampled input;
    a sampling capacitor connected between a direct-charge transfer node and a summing node;
    a primary sampling switch that connects the sampled input to the direct-charge transfer node in response to a first clock;
    a variable capacitor connected between a first sampling node and the summing node, wherein a capacitance value of the variable capacitor is determined by a digital input having a multi-bit digital value;
    a first sampling switch that connects the sampled input to the first sampling node in response to the first clock;
    a first grounding switch that connects the first sampling node to a virtual ground in response to a second clock;

a summing grounding switch that connects the summing node to the virtual ground in response to the first clock;

a connecting switch that connects the summing node to a feedback node in response to the second clock;

a feedback capacitor connected between the feedback node and the output of the amplifier; and a direct-charge transfer switch that connects the direct-charge transfer node to the output of the amplifier in response to the second clock;

wherein the feedback node drives the first input of the amplifier.

4. The PGA of claim 3 wherein the feedback node is directly connected to the first input of the amplifier.

5. The PGA of claim 3 further comprising:
a double-sampling capacitor connected between the summing node and the first input of the amplifier;
an offset switch that connects the feedback node to the first input of the amplifier in response to the first clock;
wherein the feedback node drives the first input of the amplifier through the offset switch and the summing node drives the first input of the amplifier through the double-sampling capacitor.

6. The PGA of claim 3 wherein the first input of the amplifier is an inverting input and the second input of the amplifier is a non-inverting input.

7. The PGA of claim 3 wherein the variable capacitor further comprises:
a plurality of sub-capacitors, each sub-capacitor in the plurality of sub-capacitors being enabled or disabled by a different bit in the multi-bit digital value or decoded from the multi-bit digital value;
wherein a capacitance value of the variable capacitor is a sum of capacitance values of sub-capacitors that are enabled by bits in the multi-bit digital value.

8. The PGA of claim 7 wherein the variable capacitor further comprises a plurality of sub-capacitor cells, wherein each sub-capacitor cell comprises:
a sub-capacitor having a first terminal connected to a sub-cap node and controlled by a current select bit in the multi-bit digital value or decoded from the multi-bit digital value;
a sub-sampling switch that connects the sampled input to the sub-cap node in response to the first clock and the current select bit; and
a first grounding switch that connects the sub-cap node to the virtual ground in response to the second clock.

9. The PGA of claim 8 wherein each sub-capacitor cell further comprises:
a sub-summing switch that connects a second terminal of the sub-capacitor to the summing node in response to the current select bit.

10. The PGA of claim 9 wherein the plurality of sub-capacitors comprise binary-weighted sub-capacitors having capacitance values in a binary sequence.

11. The PGA of claim 3 wherein a selected capacitance value of the variable capacitor controls a gain of the Programmable-Gain Amplifier (PGA), wherein the multi-bit digital value is adjustable to adjust the gain of the PGA.

12. The PGA of claim 11 wherein a gain of the PGA is determined by an equation:

$$V\text{out}(z)/V\text{in}(z) = (1+Cg/Cs)z^{-1/2}/[(1+Cfb/Cs)-(Cfb/Cs)z^{-1}],$$

wherein Vout is an output voltage of the amplifier, Vin is a voltage of the sampled input, Cs is a capacitance value of the sampling capacitor, Cfb is a capacitance value of the feedback capacitor, and Cg is a capacitance value of the variable capacitor that is determined by the multi-bit digital value.

13. The PGA of claim 3 further comprising:
an output switch that connects the output of the amplifier to a PGA output in response to the second clock.

14. The PGA of claim 3 further comprising:
a pre-amplifier receiving a sensor input and generating an output that is applied as the sampled input to the PGA;
a band-select filter receiving the output of the amplifier;
an Analog-to-Digital Converter (ADC), that converts the output of the amplifier from an analog value to a digital value;
wherein the PGA is part of an Analog Front-End (AFE).

15. The PGA of claim 3 wherein the sampled input is derived from an electro-cardiogram (ECG or EKG) collected by electrodes, and wherein the PGA has an adjustable gain to match amplitude and bandwidth of the sampled input to generate a cleaned ECG output having less noise than the ECG collected by the electrodes.

16. The PGA of claim 3 further comprising:
a complement sampled input, wherein the sampled input and the complement sampled input form a differential input;
a complement output of the amplifier, wherein the output of the amplifier and the complement output of the amplifier form a differential output;
a complement sampling capacitor connected between a complement direct-charge transfer node and a complement summing node;
a complement primary sampling switch that connects the complement sampled input to the complement direct-charge transfer node in response to the first clock;
a complement variable capacitor connected between a complement first sampling node and the complement summing node, wherein a complement capacitance value of the complement variable capacitor is determined by the digital input having the multi-bit digital value;
a complement first sampling switch that connects the complement sampled input to the complement first sampling node in response to the first clock;
a complement first grounding switch that connects the complement first sampling node to the virtual ground in response to a second clock;
a complement summing grounding switch that connects the complement summing node to the virtual ground in response to the first clock;
a complement connecting switch that connects the complement summing node to a complement feedback node in response to the second clock;
a complement feedback capacitor connected between the complement feedback node and the complement output of the amplifier; and
a complement direct-charge transfer switch that connects the complement direct-charge transfer node to the complement output of the amplifier in response to the second clock;
wherein the complement feedback node drives the second input of the amplifier.

17. The PGA of claim 16 further comprising:
a complement double-sampling capacitor connected between the complement summing node and the second input of the amplifier;
a complement offset switch that connects the complement feedback node to the second input of the amplifier in response to the first clock;

wherein the complement feedback node drives the second input of the amplifier through the complement offset switch and the complement summing node drives the second input of the amplifier through the complement double-sampling capacitor.

18. A front-end circuit comprising:

amplifier means for generating an output in response to a difference between a first input and a second input;

sampling switch means for connecting a sampled input to a direct-charge node in response to a first clock;

sampling capacitor means for storing a charge between the direct-charge node and a summing node;

variable capacitor means having a plurality of sub-capacitors that are enabled by a multi-bit digital value to set a gain of the front-end circuit;

a plurality of first switch means for connecting the sampled input to first plates of enabled sub-capacitors in the plurality of sub-capacitors in response to the first clock;

a plurality of first grounding switch means for connecting a virtual ground to the first plates of enabled sub-capacitors in the plurality of sub-capacitors in response to a second clock;

wherein second plates of enabled sub-capacitors in the plurality of sub-capacitors are connected to the summing node;

summing grounding switch means for connecting the summing node to the virtual ground in response to the first clock;

connecting switch means for connecting the summing node to a feedback node in response to the second clock;

feedback capacitor means for storing charge between the feedback node and the output of the amplifier means;

direct-charge transfer switch means for connecting the direct-charge node to the output of the amplifier means in response to the second clock;

double-sampling capacitor means for storing charge between the summing node and the first input of the amplifier means; and offset switch means for connecting the feedback node to the first input of the amplifier means in response to the first clock.

19. The front-end circuit of claim 18 further comprising:

Analog-to-Digital Converter (ADC) means for converting the output of the amplifier means from an analog voltage or current to a digital value having multiple binary bits;

pre-amplifier means for receiving a sensor input from a physical sensor device and for generating the sampled input, whereby the front-end circuit is an Analog Front-End (AFE).

\* \* \* \* \*